United States Patent
Song

(10) Patent No.: US 7,170,805 B2
(45) Date of Patent: Jan. 30, 2007

(54) MEMORY DEVICES HAVING BIT LINE PRECHARGE CIRCUITS WITH OFF CURRENT PRECHARGE CONTROL AND ASSOCIATED BIT LINE PRECHARGE METHODS

(75) Inventor: Tae-joong Song, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 194 days.

(21) Appl. No.: 10/783,481

(22) Filed: Feb. 20, 2004

(65) Prior Publication Data

US 2004/0246799 A1 Dec. 9, 2004

(30) Foreign Application Priority Data

Jun. 9, 2003 (KR) .................... 10-2003-0036748

(51) Int. Cl.
G11C 7/00 (2006.01)
G11C 5/06 (2006.01)
G11C 11/00 (2006.01)
G11C 7/10 (2006.01)

(52) U.S. Cl. .................. 365/203; 365/72; 365/154; 365/189.08; 365/194

(58) Field of Classification Search .............. 365/203, 365/194, 154
See application file for complete search history.

(56) References Cited

U.S. PATENT DOCUMENTS

| | | | |
|---|---|---|---|
| 5,047,984 A | 9/1991 | Monden | 365/203 |
| 5,262,995 A * | 11/1993 | Yu | 365/203 |
| 5,625,598 A | 4/1997 | Oba | 365/203 |
| 5,757,205 A * | 5/1998 | Ciraula et al. | 326/21 |
| 5,828,612 A * | 10/1998 | Yu et al. | 365/203 |
| 6,507,526 B1 * | 1/2003 | Ohtake | 365/203 |
| 6,888,768 B1 * | 5/2005 | Sugio | 365/203 |
| 2001/0052624 A1 * | 12/2001 | Houston | 257/390 |
| 2002/0131320 A1 * | 9/2002 | Kurjanowicz et al. | 365/233 |
| 2003/0025548 A1 * | 2/2003 | Jang | 327/390 |
| 2003/0123311 A1 * | 7/2003 | Park | 365/203 |
| 2003/0174567 A1 * | 9/2003 | Kim et al. | 365/201 |
| 2004/0109366 A1 * | 6/2004 | Moon et al. | 365/200 |
| 2004/0114411 A1 * | 6/2004 | Noda et al. | 365/49 |

(Continued)

FOREIGN PATENT DOCUMENTS

JP 6162775 6/1994

(Continued)

OTHER PUBLICATIONS

Notice to Submit a Response for Korean patent application No. 10-2003-0036748 mailed on Jul. 28, 2005.

*Primary Examiner*—Amir Zarabian
*Assistant Examiner*—Ly Duy Pham
(74) *Attorney, Agent, or Firm*—Myers Bigel Sibley & Sajovec

(57) ABSTRACT

A memory device having an off-current (Ioff) robust precharge control circuit and a bit line precharge method are provided. The precharge control circuit may be embodied as a delay circuit unit which receives and delays a precharge enable signal for a predetermined delay time; a NAND gate which receives the precharge enable signal and the output of the delay circuit; and an inverter which inverts the output of the NAND gate. The precharge control circuit may enable the word lines before disabling the precharge signal.

12 Claims, 7 Drawing Sheets

U.S. PATENT DOCUMENTS

2004/0240303 A1* 12/2004 Kim ................ 365/230.06
2005/0128837 A1*  6/2005 Kim .................... 365/203

FOREIGN PATENT DOCUMENTS

| | | | | |
|---|---|---|---|---|
| JP | 180682 | | | 4/1997 |
| JP | 2003115199 | A | * | 4/2003 |
| KR | 1996-025777 | | | 7/1996 |
| KR | 2002047876 | A | * | 6/2002 |
| KR | 2002054857 | A | * | 7/2002 |
| KR | 2002058267 | A | * | 7/2002 |
| KR | 10-2002-0087268 | | | 11/2002 |

* cited by examiner

PRIOR ART

MEMORY DEVICES HAVING BIT LINE PRECHARGE CIRCUITS WITH OFF CURRENT PRECHARGE CONTROL AND ASSOCIATED BIT LINE PRECHARGE METHODS

CROSS REFERENCE TO RELATED APPLICATION

This application claims priority under 35 U.S.C. § 119 from Korean Patent Application No. 2003-36748, filed Jun. 9, 2003, the contents of which are incorporated herein by reference in their entirety.

FIELD OF THE INVENTION

The present invention relates to semiconductor memory devices and, more particularly, to semiconductor memory devices having bit line precharge circuits and associated methods of pre-charging bit lines.

BACKGROUND OF THE INVENTION

As semiconductor memory processing technology has advanced, smaller and smaller semiconductor memory devices are being introduced. Deep sub-micron processes are now being developed to facilitate production of small, highly integrated, memory devices. In order to improve the performance of transistors developed using deep sub-micron technology, the threshold voltage (Vth) of the transistor may be reduced. When the threshold voltage is lowered, however, both the saturation current of the transistor in its "on" state and the leakage or "off-current" (Ioff) of the transistor in its "off" state may increase.

FIG. 1 is a diagram of a memory cell array 100 that may be used to illustrate the impact of a leakage current. The memory cell array includes a plurality of memory cells 102, 104, 106, . . . . As will be appreciated by those of skill in the art, these individual memory cells 102, 104, 106 are typically arranged in rows and columns to form the memory cell array 100. As shown in FIG. 1, in the memory cell array 100, the memory cells 102, 104, 106, . . . are located at intersections of a plurality of word lines (WL0, WL1, WL2, . . . ), a bit line (BL) and a complementary bit line (BLB). For convenience of explanation, in the following description it is assumed that the power supply voltage (VDD) corresponding to logic level "1" is stored in a first node (NA) and the ground or reference voltage (VSS) corresponding to logic level "0" is stored in a second node (NB). In the example of FIG. 1, the ground voltage (VSS) is set as 0 volts, although other ground voltages (VSS) may be used.

When the first word line (WL0) is enabled, the first memory cell 102 is activated and data stored in the first memory cell 102 is transferred to the bit line (BL) and the complementary bit line (BLB). Data in the first memory cell 102 experiences charge sharing such that a voltage difference between the bit line (BL) and the complementary bit line (BLB) occurs. Referring to FIG. 1, the bit line (BL) moves toward the power supply voltage (VDD) level and the complementary bit line (BLB) moves toward the ground voltage (VSS) level such that a voltage difference occurs. This voltage difference is sensed and amplified by a sense amplifier (not shown) so that the data in the memory cell 102 can be determined.

As shown in FIG. 1, both memory cell 104, which is connected to the second word line (WL1), and memory cell 106, which is connected to the third word line (WL2), are deactivated such that they are not connected to the bit line (BL) or the complementary bit line (BLB). However, the off-current (Ioff) or leakage current of the memory cells 104 and 106 flows from the bit line (BL) into the transistors of memory cells 104 and 106 storing logic zeros such that the power supply voltage level of the bit line (BL) is lowered. As a result, the voltage difference between the bit line (BL) and the complementary bit line (BLB) decreases. This decrease results in a reduction of the sensing speed of the sense amplifier.

When the word lines (WL0, WL1, WL2, . . . ) are enabled in response to a decoded row address, the bit line (BL) and the complementary bit line (BLB) are precharged to the power supply voltage (VDD) in response to a precharge signal (PRE). After the bit line (BL) and the complimentary bit line (BLB) are precharged a voltage difference due to the memory cell data occurs that is sensed and amplified by the sense amplifier. Circuit blocks related to these operations are shown in FIG. 2.

As shown in FIG. 2, the circuit blocks include a memory cell array block 100, a row decoder 210, a pre-address decoding circuit and control signal generation unit 220, a bit line precharge unit 230 and a sense amplifier 240. The row decoder 210 and the pre-address decoding circuit 220 perform operations for enabling word lines (WL0, . . . , WLn), and the bit line precharge circuit 230 that responds to a precharge signal (PRE) performs operations to precharge the bit line (BL) and the complementary bit line (BLB) to the power supply voltage (VDD) level. The sense amplifier 240 senses and amplifies the bit line (BL) and the complementary bit line (BLB) in which a voltage difference occurs in response to a control signal (SENSE).

FIG. 3 is a diagram illustrating the operational timing of the circuit of FIG. 2. Referring to FIG. 3, intervals (a) through (d) are shown. In interval (a), the precharge signal (PRE) is at a "low" logic level and in response to this the bit line (BL) and the complementary bit line (BLB) are precharged to the power supply voltage (VDD) level. Interval (b) is a floating interval during which the precharge signal (PRE) transitions to a "high" logic level (i.e., is disabled). In interval (c), word line (WL0) transitions to a "high" logic level and is enabled. During interval (c) a voltage difference between the bit line (BL) and the complementary bit line (BLB) also occurs (due to the memory cell data), and a control signal (SENSE) transitions to a "high" logic level (i.e., is enabled). As a result, the voltage difference between the bit line (BL) and the complementary bit line (BLB) is sensed and amplified. In interval (d), the precharge signal (PRE) transitions to a "low" logic level (i.e., is enabled) such that the bit line (BL) and the complementary bit line (BLB) are again precharged to the power supply voltage (VDD) level.

In the operation of the circuit of FIG. 2, during interval (b), before the word line (WL0) is enabled, the voltage levels of the bit line (BL) and the complementary bit line (BLB), which are precharged to the power supply voltage (VDD) level, are lowered due to the effect of the off-current (Ioff) described above with respect to FIG. 1. Accordingly, additional time may be required to arrive at the voltage difference between the bit line (BL) and the complementary bit line (BLB) that can be sensed by the sense amplifier. Thus, the off-current can act to reduce the operation speed of the memory device.

SUMMARY OF THE INVENTION

Embodiments of the present invention provide semiconductor memory devices that have a memory cell array, an address decoder, a precharge control circuit and a precharge unit. The memory cell array has a set of memory cells that are accessed via a set of word lines and first and second bit lines. The address decoder, which is coupled to the word lines, decodes a received address signal. The precharge control circuit generates a precharge signal in response to a precharge enable signal and a precharge delay signal, and the precharge unit precharges the first and second bit lines in response to the precharge signal. In some embodiments of the present invention, the precharge control circuit may generate the precharge signal by performing a logical AND operation on the precharge enable signal and the precharge delay signal.

The semiconductor memory device may also include a delay circuit that generates the precharge delay signal by delaying the precharge enable signal for a predetermined delay time. The delay circuit may be embodied, for example, as a NOR gate which receives the precharge enable signal and an inverter which inverts the output of the NOR gate. The predetermined delay time may be the time that it takes the word lines to become enabled in response to a transition of the decoded address signal. In embodiments of the present invention, the precharge control circuit may be implemented as a NAND gate which receives the precharge enable signal and the precharge delay signal and an inverter which inverts the output of the NAND gate.

The precharge unit may be embodied as first and second transistors that precharge the first bit line and the second bit line, respectively, to the power supply voltage level in response to the precharge signal and a third transistor which equalizes the voltage of the first bit line and the second bit line. The first, second and third transistors may be PMOS transistors. The precharge signal may be disabled after one of the plurality of word lines is enabled in response to the decoded address signal. This disablement of the precharge signal may occur a predetermined time after the precharge enable signal is disabled. The precharge signal may be enabled at substantially the same time that the precharge enable signal is enabled.

Pursuant to further embodiments of the present invention, the precharge control circuit of the semiconductor memory devices may generate the precharge signal in response to the decoded address signal and the precharge enable signal. In these embodiments, the precharge unit precharges the first and second bit lines in response to the precharge signal, and the precharge signal is disabled after one of the word lines is enabled. In these embodiments, the precharge control circuit may include a NOR gate which receives the decoded address signals, a first inverter which inverts the output of the NOR gate, a NAND gate which receives the output of the first inverter and the precharge enable signal and a second inverter which inverts the output of the NAND gate to generate the precharge signal.

Pursuant to further embodiments of the present invention, methods of pre-charging first and second bit lines on a semiconductor memory device are provided. Pursuant to these methods, the first and second bit lines are precharged in response to a precharge enable signal transitioning to a first level. This pre-charging operation continues until a predetermined time after the precharge enable signal transitions to a second level. The predetermined time may be the time that it takes the word lines to become enabled in response to a transition of the decoded address signal. The precharge of the first and second bit lines may be resumed in response to the precharge enable signal transitioning back to the first level.

In still further embodiments of the present invention, methods for pre-charging a first bit line and a second bit line of a memory cell array are provided in which a precharge signal is generated in response to a precharge enable signal and a precharge delay signal. The first and second bit lines are then precharged in response to the precharge signal. A word line is enabled in response to a decoded address signal. The precharge signal is then disabled after the word line is enabled. In these methods, the precharge delay signal may be generated by delaying the precharge enable signal for a predetermined time, and the predetermined delay time may be the time that it takes the word lines to become enabled in response to a transition of the decoded address signal.

In embodiments of the present invention the precharge signal is only disabled after the word line is enabled. As a result, the effect of the off-current on the circuit may be reduced or eliminated, and the voltage difference between the bit line and the complementary bit line may be increased providing an enhanced sensing margin.

DETAILED DESCRIPTION

Figure 1:
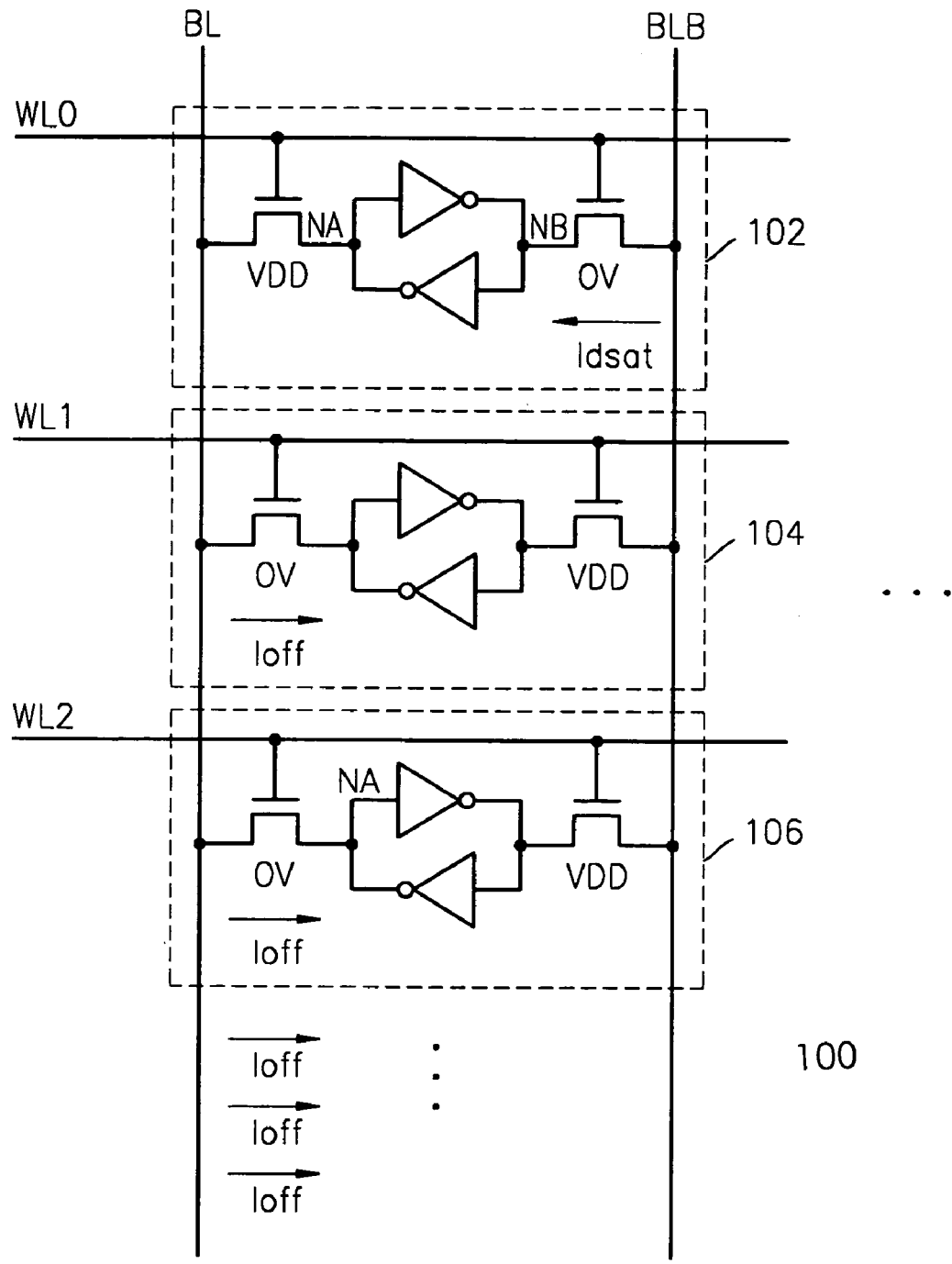
FIG. 1 is a diagram of a prior art memory cell array.

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like reference numerals refer to like elements throughout.

Figure 4:
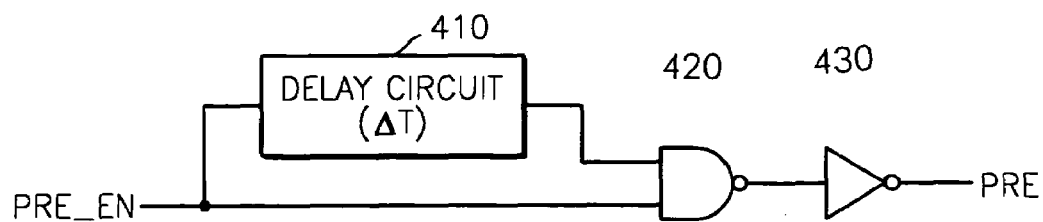
FIG. 4 is a diagram illustrating a circuit and method of generating precharge signals according to embodiments of the present invention.

FIG. 4 depicts a circuit and method for generating a precharge signal (PRE). The precharge signal (PRE) is activated and inactivated in response to a precharge enable signal (PRE_EN). As shown in FIG. 4, the precharge enable signal (PRE_EN) is input to a delay circuit 410 which delays the precharge enable signal (PRE_EN) for a predetermined time ($\Delta T$). Both the delayed precharge enable signal that is output from the delay circuit 410 and the precharge enable signal (PRE_EN) are input to a NAND gate 420. The output of the NAND gate 420 is input to an inverter 430 which outputs the precharge signal (PRE). Thus, according to the precharge control circuit of FIG. 4, the precharge signal (PRE) is inactivated a predetermined time (ΔT) after the precharge enable signal (PRE_EN) is inactivated, while the precharge signal (PRE) is activated at the same time that the precharge enable signal (PRE_EN) is activated.

Embodiments of the present invention and their operation will now be explained and contrasted to the operation of the precharge circuit 230 of the prior art memory device of FIG. 2.

Figure 2:
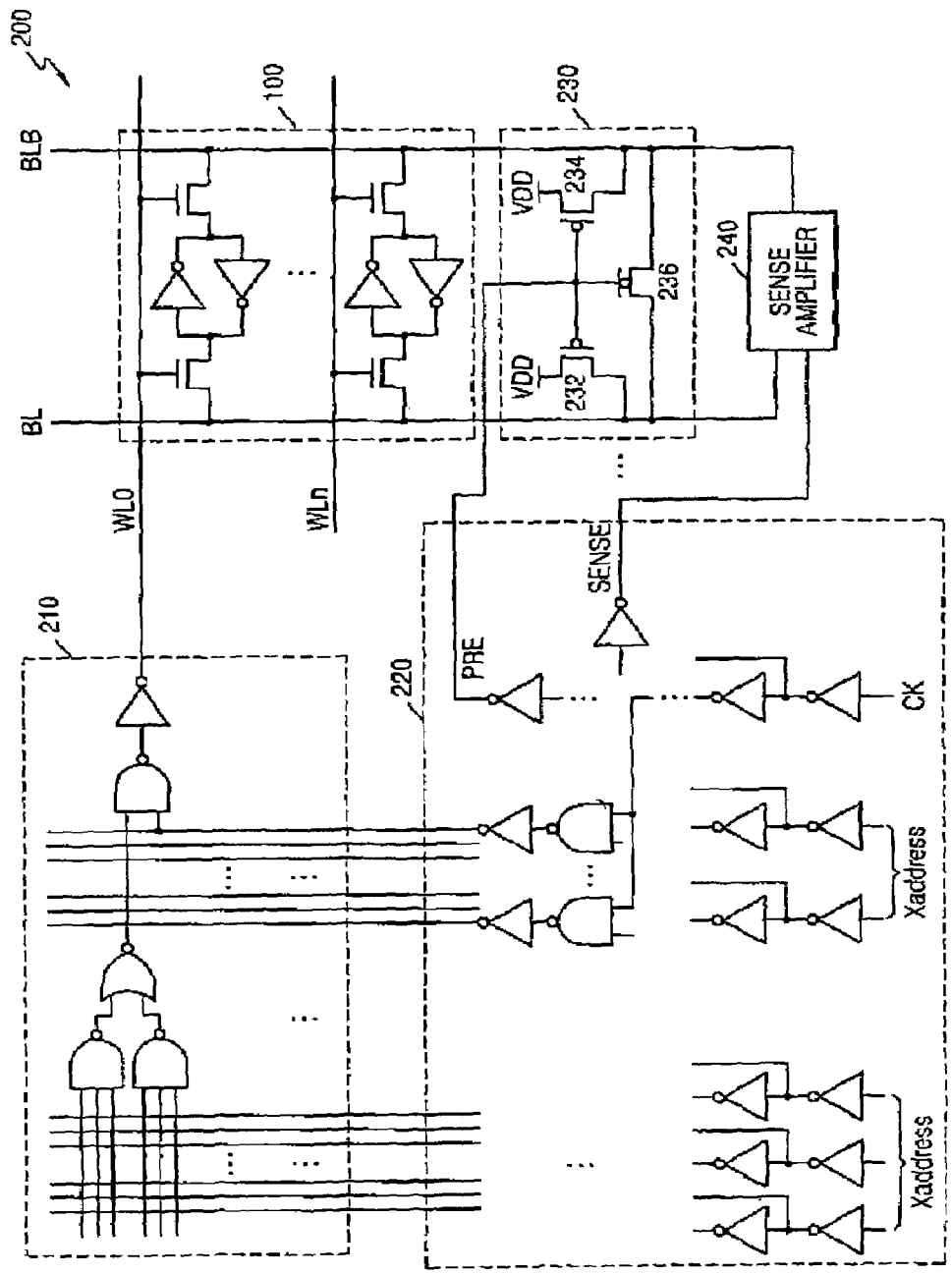
FIG. 2 is a diagram illustrating a circuit included in a prior art memory device.

The precharge circuit 230 of FIG. 2 comprises first and second PMOS transistors 232 and 234, which precharge the bit line (BL) and the complementary bit line (BLB) to the power supply voltage (VDD) level in response to the precharge signal (PRE). The precharge circuit 230 further includes a third PMOS transistor 236 which equalizes the bit line (BL) and the complementary bit line (BLB) to the power supply voltage (VDD) level in response to the precharge signal (PRE). The "precharge signal" refers to any signal that either directly or indirectly acts to cause the precharge circuit 230 to precharge one or more bit lines. The precharge circuit 230 precharges the bit line (BL) and the complementary bit line (BLB) to the power supply voltage (VDD) level when the precharge signal (PRE) is at a "low" logic level, and disables the precharge operation of the bit line (BL) and the complementary bit line (BLB) when the precharge signal (PRE) is at a "high" logic level. It will be appreciated by those of skill in the art that the precharge circuit can be implemented in a wide variety of different ways, and that the present invention is not limited to the exemplary embodiments depicted in FIGS. 2 and 5, but encompasses any precharge unit that is capable of pre-charging the bit line (BL) and the complementary bit line (BLB).

In the circuit depicted in FIG. 4, when the precharge enable signal (PRE_EN) is at a "low" logic level, thereby initiating a bit line precharge operation, the output of the NAND gate 420 is at "high" logic level. The inverter 430 converts this "high" logic signal to a "low" logic signal that is output as the precharge signal (PRE). As noted above, when the precharge signal (PRE) is at a "low" logic level, the bit line (BL) and the complementary bit line (BLB) are precharged to the power supply voltage (VDD) level. A predetermined time (ΔT), which corresponds to the delay time of the delay circuit 410, after the time when the precharge enable signal (PRE_EN) transitions to a "high" logic level, the output of the NAND gate 420 transitions to a "low" logic level signal and the precharge signal (PRE) transitions to a "high" logic level. As illustrated in FIG. 2, the transition of the precharge signal (PRE) to a "high" logic level causes the PMOS transistors 232, 234 and 236 of the precharge circuit 230 to turn off and the precharge operation of the bit line (BL) and the complementary bit line (BLB) is disabled.

In embodiments of the present invention, the predetermined time (ΔT) may be the time that it takes to enable a word line in response to decoded row addresses (i.e., the delay between the time when the row addresses transition to the time at which the word line is enabled in response thereto). When the predetermined time (ΔT) is set in such a manner the precharge operation will be disabled after the word line is enabled.

Figure 5:
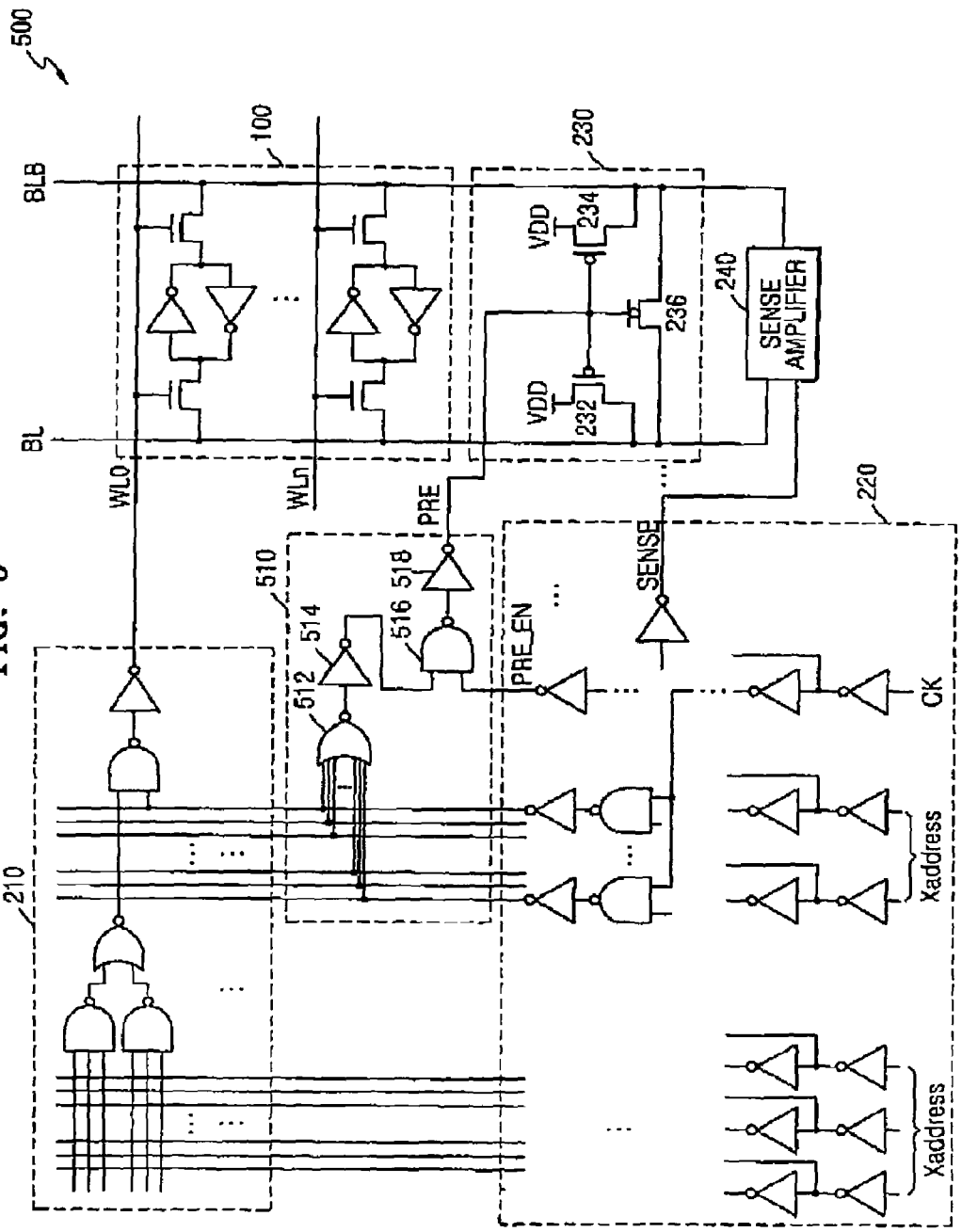
FIG. 5 is a diagram of a memory device according to embodiments of the present invention.

FIG. 5 is a circuit diagram illustrating a memory device according to embodiments of the present invention that includes a precharge control circuit. As shown in FIG. 5, the memory device 500, like the memory device 200 of FIG. 2, may include a memory cell array block 100, a row decoder 210, a pre-address decoding circuit and control signal generation unit 220, a bit line precharge unit 230, and a sense amplifier 240. Additionally, the memory device 500 of FIG. 5 further includes a precharge control circuit unit 510.

As shown in FIG. 5, in embodiments of the present invention the precharge control circuit unit 510 may be implemented as a NOR gate 512 which receives decoded row addresses provided by the pre-address decoding circuit 220, a first inverter 514 which receives the output of the NOR gate 512, a NAND gate 516 which receives the output of the first inverter 514 and a precharge enable signal (PRE_EN), and a second inverter 518 which inverts the output of the NAND gate 516 and generates a precharge signal (PRE).

In response to the transition of the decoded row addresses to a "high" logic level, the NOR gate 512 outputs a "low" logic level signal. When this occurs, if the precharge enable signal (PRE_EN) is at a "low" logic level, the NAND gate 516 and the inverter 518 generate a precharge signal (PRE) that is at a "low" logic level and the bit line (BL) and the complementary bit line (BLB) are precharged. If the precharge enable signal (PRE_EN) is at a "high" logic level, the NAND gate 516 and the inverter 518 generate a precharge signal (PRE) that is at a "high" logic level and the precharge of the bit line (BL) and the complementary bit line (BLB) is disabled.

If instead the decoded row addresses are at a "low" logic level, the NOR gate 512 outputs a "high" logic level signal and the NAND gate 516 and the inverter 518 generate a precharge signal (PRE) that is at a "low" logic level regardless of the logic level of the precharge enable signal (PRE_EN). In this manner, the bit line (BL) and the complementary bit line (BLB) are precharged during a time when the word lines (WL0, . . . , WLn) are not enabled.

Figure 3:
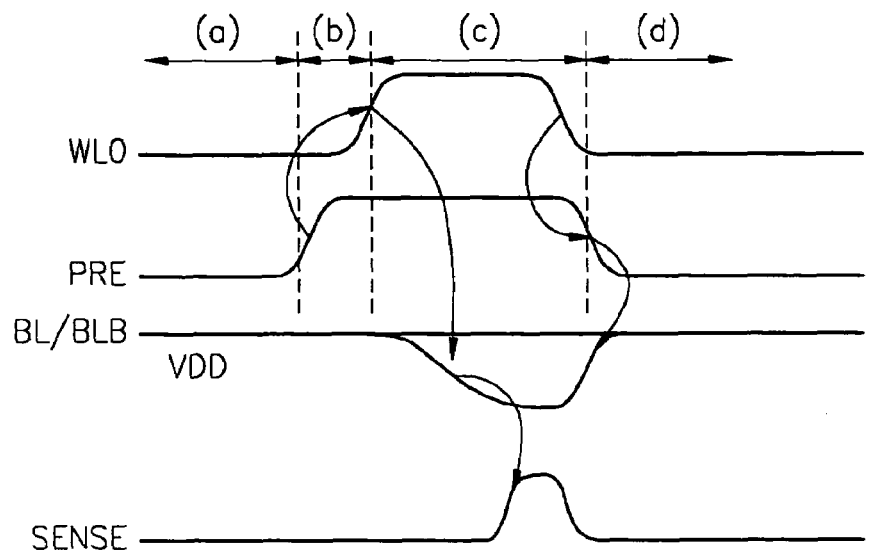
FIG. 3 is a timing diagram illustrating the operational timing of the memory device of FIG. 2.
Figure 6:
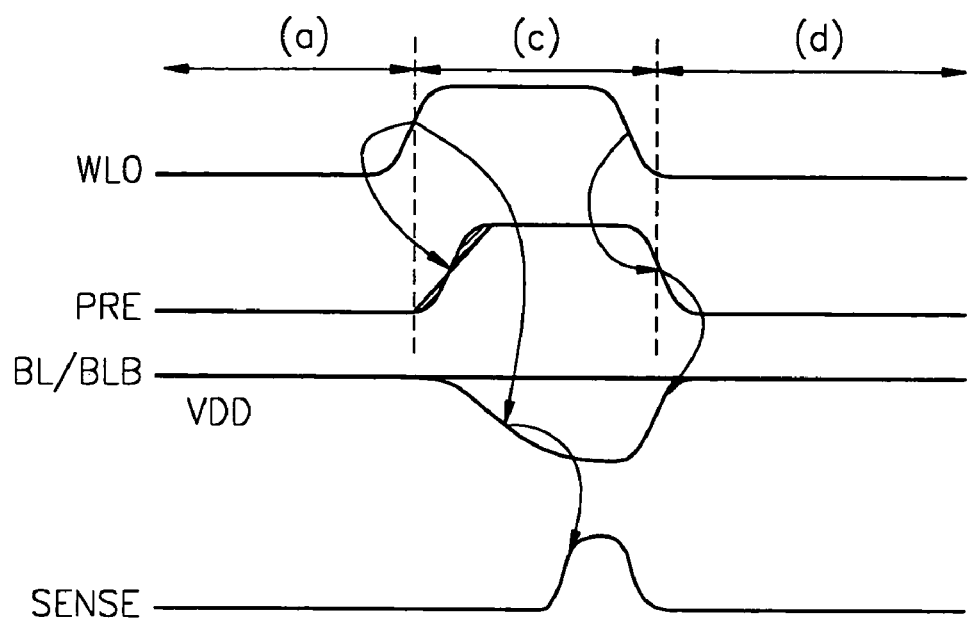
FIG. 6 is a timing diagram illustrating the operational timing of the memory device of FIG. 5.

FIG. 6 is a timing diagram illustrating the operational timing of the memory device of FIG. 5. A comparison of FIG. 6 to the timing diagram of FIG. 3 shows that the timing diagram of FIG. 6 includes intervals (a), (c) and (d) but does not include the interval (b) that is present in the timing diagram of FIG. 3. In the timing diagram of FIG. 6, during interval (a) the bit line (BL) and the complementary bit line (BLB) are precharged to the power supply voltage (VDD) level in response to the precharge signal (PRE) being in a "low" logic level. In interval (c), the precharge signal (PRE) transitions to a "high" logic level (i.e., is disabled) in response to word line (WL0) being enabled to a "high" logic level. According to the data of the memory cell connected to the enabled word line (WL0), the bit line (BL) and the complementary bit line (BLB) experience charge sharing and the voltage difference between the bit line (BL) and the complementary bit line (BLB) increases. The sensing enable signal (SENSE) senses this voltage difference between the bit line (BL) and the complementary bit line (BLB). During interval (d), word line (WL0) is disabled and the precharge signal (PRE) returns to a "low" logic level. In response to this transition of the precharge signal (PRE), the bit line (BL) and the complementary bit line (BLB) are again precharged.

As discussed above, the precharge control circuit 510 may include circuit elements that implement the predetermined delay that is applied to the precharge enable signal in embodiments of the present invention. In other embodiments of the present invention, the semiconductor memory device may include a separate delay circuit that generates a precharge delay signal by, for example, delaying the precharge enable signal for a predetermined time. The precharge delay signal may then be input to the precharge control circuit, which in response to the precharge delay signal and the precharge enable signal generates the precharge signal.

Figure 7:
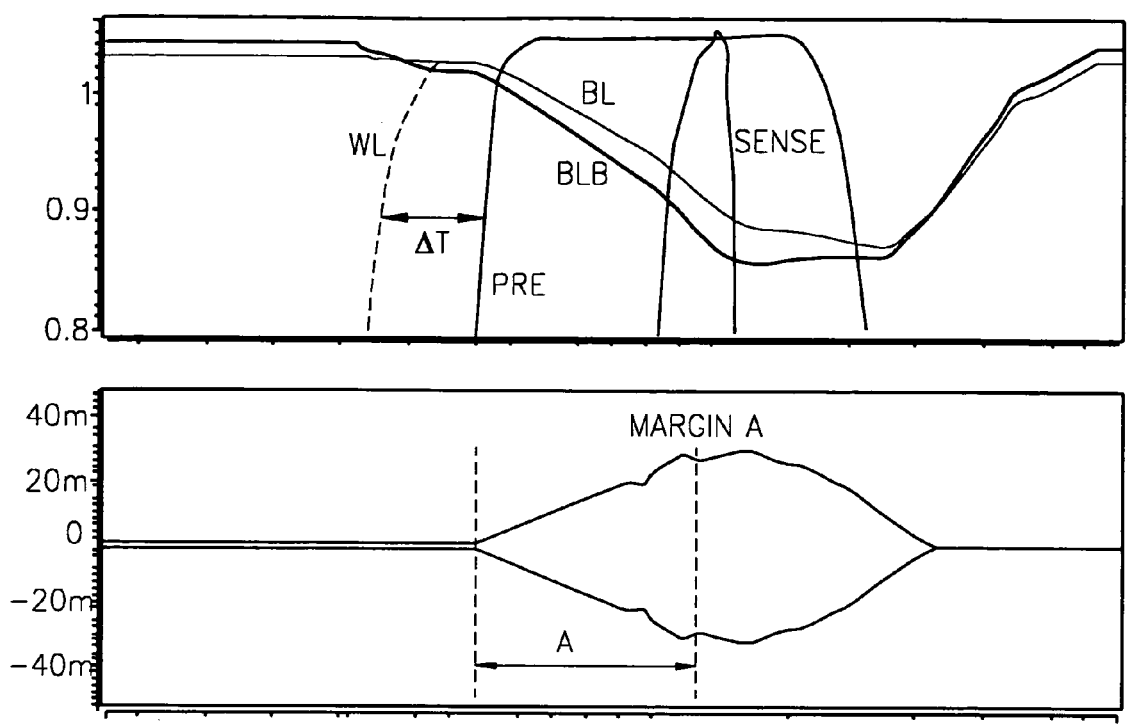
FIG. 7 is a pair of graphs illustrating the simulated performance of memory devices according to embodiments of the present invention.

FIG. 7 is a diagram illustrating simulated performance of memory devices according to embodiments of the present invention. As shown in FIG. 7, in response to the decoded address signal, word line (WL) is enabled and transitions to a "high" logic level. After a predetermined time ($\Delta T$), the precharge signal (PRE) transitions to a "high" logic level and is disabled. Starting at the time when the word line (WL) is enabled, the voltage difference between the bit line (BL) and the complementary bit line (BLB) is slowly generated, and at the time when the precharge signal (PRE) is disabled, the voltage difference between the bit line (BL) and the complementary bit line (BLB) increases further. Since the voltage difference between the bit line (BL) and the complementary bit line (BLB) is relatively large, the sensing margin can be made greater during an activated interval of the sensing enable signal (SENSE) where the voltage difference between the bit line (BL) and the complementary bit line (BLB) is sensed and amplified.

Figure 8:
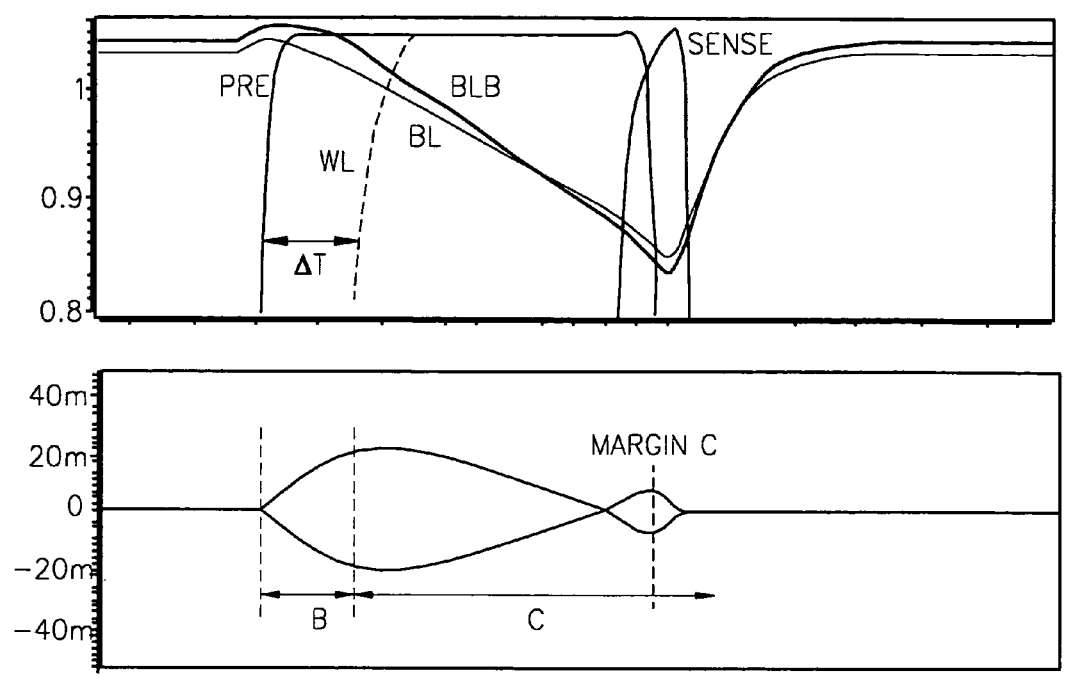
FIG. 8 is a pair of graphs illustrating the simulated performance of the prior art memory device of FIG. 1.

FIG. 8 is a diagram illustrating the simulated performance of the prior art memory device of FIG. 2. As shown in FIG. 8, the precharge signal (PRE) transitions to a "high" logic level and is disabled. After a predetermined time ($\Delta T$), the word line (WL) transitions to a "high" logic level and is enabled. Once the precharge signal (PRE) is disabled, the voltage difference between the bit line (BL) and the complementary bit line (BLB) begins to take place. However, due to the effect of the off-current (Ioff), the bit line moves toward a "low" logic level and the complementary bit line (BLB) moves toward a "high" logic level, which is the opposite of expected normal voltage levels. After the word line (WL) is enabled and a subsequent delay transpires, the direction of the bit line (BL) movement is reversed toward the "high" logic level and the direction of the complementary bit line (BLB) movement is reversed toward the "low" logic level and the voltage difference increases. However, as a result of the off-current, the voltage difference between the bit line (BL) and the complementary bit line (BLB) may be relatively small. Thus, during the activated interval of the sensing enable signal (SENSE) where the voltage difference between the bit line (BL) and the complementary bit line (BLB) is sensed and amplified, the sensing margin decreases.

The methods and systems for enabling the word line (WL) and then disabling the precharge signal (PRE) according to embodiments of the present invention may cause current consumption during the time interval between the enabling of the word line (WL) to the disabling of the precharge signal (PRE) due to formation of a current path between the power supply voltage that is the bit line precharge voltage and memory cell data that is in a "low" logic level. However, the methods and systems according to embodiments of the present invention can increase the voltage difference between the bit line (BL) and the complementary bit line (BLB) while reducing or eliminating the effects of the off-current (Ioff).

While this invention has been particularly shown and described with reference to certain embodiments thereof, it will be understood by those skilled in the art that various changes in form and details may be made therein without departing from the spirit and scope of the invention as defined by the appended claims and equivalents.

What is claimed is:

1. A semiconductor memory device, comprising:
    a memory cell array having a plurality of memory cells, a plurality of word lines, and first and second bit lines;
    an address decoder which decodes a received address signal, wherein the address decoder is coupled to the plurality of word lines;
    a precharge control circuit that generates a precharge signal in response to a precharge enable signal and a precharge delay signal;
    a precharge unit that precharges the first and second bit lines in response to the precharge signal; and
    a delay circuit which generates the precharge delay signal by delaying the precharge enable signal for a predetermined delay time,
    wherein the predetermined delay time comprises the time that it takes the word lines to become enabled in response to a transition of the decoded address signal.

2. The semiconductor memory device of claim 1, wherein the precharge control circuit comprises:
    a NAND gate which receives the precharge enable signal and the precharge delay signal; and
    an inverter which inverts the output of the NAND gate.

3. The semiconductor memory device of claim 1, wherein the precharge unit comprises:
    a first transistor which in response to the precharge signal precharges the first bit line to a power supply voltage level;
    a second transistor which in response to the precharge signal precharges the second bit line to a power supply voltage level; and
    a third transistor which in response to the precharge signal equalizes the voltage of the first bit line and the second bit line.

4. The semiconductor memory device of claim 3, wherein the first, second and third transistors are PMOS transistors.

5. The semiconductor memory device of claim 1, wherein the precharge control circuit generates the precharge signal by performing a logical AND operation on the precharge enable signal and the precharge delay signal.

6. The semiconductor memory device of claim 1 wherein the address decoder is a row address decoder and wherein the decoded address signal comprises a row address.

7. The semiconductor device of claim 6, wherein the precharge signal is disabled after one of the plurality of word lines is enabled in response to the decoded address signal.

8. The semiconductor device of claim 1, wherein the precharge signal is disabled a predetermined time after the precharge enable signal is disabled.

9. A semiconductor memory device, comprising:
    a memory cell array having a plurality of memory cells, a plurality of word lines, and first and second bit lines;
    an address decoder which decodes a received address signal, wherein the address decoder is coupled to the plurality of word lines;
    a precharge control circuit that generates a precharge signal in response to a precharge enable signal and a precharge delay signal;
    a precharge unit that precharges the first and second bit lines in response to the precharge signal; and
    a delay circuit which generates the precharge delay signal by delaying the precharge enable signal for a predetermined delay time, wherein the delay circuit comprises a NOR gate which receives the precharge enable signal and an inverter which inverts the output of the NOR gate.

10. A semiconductor memory device, comprising:
a memory cell array having a plurality of memory cells, a plurality of word lines, and first and second bit lines;
an address decoder which decodes a received address signal, wherein the address decoder is coupled to the plurality of word lines;
a precharge control circuit that generates a precharge signal in response to a precharge enable signal and a precharge delay signal; and
a precharge unit that precharges the first and second bit lines in response to the precharge signal;
wherein the precharge signal is disabled a predetermined time after the precharge enable signal is disabled, and
wherein the precharge signal is enabled at substantially the same time that the precharge enable signal is enabled.

11. A method for pre-charging a first bit line and a second bit line of a memory cell array, the method comprising:
decoding a received address signal;
generating a precharge signal in response to a precharge enable signal and a precharge delay signal;
pre-charging the first bit line and the second bit line in response to the precharge signal; and
enabling a word line in response to the decoded address signal, wherein the precharge signal is disabled after the word line is enabled,
wherein the precharge delay signal is generated by delaying the precharge enable signal for the time that it takes the word lines to become enabled in response to a transition of the decoded address signal.

12. The method of claim 11, wherein the precharge signal is disabled a predetermined time after the precharge enable signal is disabled.

* * * * *